United States Patent
Yoshikawa et al.

(10) Patent No.: US 6,754,053 B2
(45) Date of Patent: Jun. 22, 2004

(54) MAGNETORESISTANCE EFFECT ELEMENT, MAGNETIC HEAD AND MAGNETIC REPRODUCING APPARATUS

(75) Inventors: Masatoshi Yoshikawa, Kanagawa-ken (JP); Masashi Sahashi, Kanagawa-ken (JP); Katsuhiko Koi, Kanagawa-ken (JP); Hitoshi Iwasaki, Kanagawa-ken (JP); Hiromi Yuasa, Kanagawa-ken (JP); Hideaki Fukuzawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 67 days.

(21) Appl. No.: 10/108,472

(22) Filed: Mar. 29, 2002

(65) Prior Publication Data

US 2002/0191354 A1 Dec. 19, 2002

(30) Foreign Application Priority Data

Mar. 30, 2001 (JP) .................................... 2001-099360

(51) Int. Cl.⁷ .............................................. G11B 5/127
(52) U.S. Cl. .................................................. 360/324.1
(58) Field of Search ........................ 360/324.1, 324.11, 360/324.12, 324.2, 322, 327.3, 327.31

(56) References Cited

U.S. PATENT DOCUMENTS

| 6,185,079 B1 | * | 2/2001 | Gill ........................ 360/324.2 |
| 6,327,121 B1 | * | 12/2001 | Nagasawa et al. ..... 360/324.11 |
| 6,340,533 B1 | * | 1/2002 | Ueno et al. ............ 360/324.11 |
| 6,466,419 B1 | * | 10/2002 | Mao ....................... 360/324.12 |
| 6,538,858 B1 | * | 3/2003 | Hasegawa et al. ..... 360/324.12 |
| 6,587,315 B1 | * | 7/2003 | Aoki et al. ................. 360/322 |
| 2002/0036876 A1 | | 3/2002 | Kawawake et al. |

\* cited by examiner

*Primary Examiner*—Allen Cao
(74) *Attorney, Agent, or Firm*—Oblon, Spivak, McClelland, Maier & Neustadt, P.C.

(57) ABSTRACT

A magnetoresistance effect film including a magnetically pinned layer, a non-magnetic intermediate layer and a magnetically free layer has sidewall layers covering at least side surfaces of the magnetically pinned layer and the non-magnetic intermediate layer. The sidewall layers are made of a high-resistance oxide, nitride, fluoride, boride, sulfide or carbide having a specular reflection effect against conduction electrons, thereby to prevent non-elastic scattering of electrons and missing of spin information on side surfaces of the magnetoresistance effect film.

12 Claims, 7 Drawing Sheets

MAGNETORESISTANCE EFFECT ELEMENT, MAGNETIC HEAD AND MAGNETIC REPRODUCING APPARATUS

CROSS-REFERENCE TO RELATED APPLICATIONS

This application is based upon and claims the benefit of priority from the prior Japanese Patent Application No. 2003-099360, filed on Mar. 30, 2001; the entire contents of which are incorporated herein by reference.

BACKGROUND OF THE INVENTION

This invention relates to a magnetoresistance effect element; magnetic head and magnetic reproducing apparatus. More particularly, the invention relates to a magnetoresistance effect element configured to carry a sense current perpendicular to the film plane of a magnetoresistance effect film, and also to a magnetic head and a magnetic reproducing apparatus using the magnetoresistance effect element.

Discovery of giant magnetoresistance effect in a multi-layered structure of magnetic layers has triggered remarkable improvement of the function of magnetic devices, especially the function of magnetic heads. Especially, discovery of the giant magnetoresistance effect (GMR) by a spin valve (SV) film has brought about great technical development in the field of magnetic devices. A spin valve film includes a non-magnetic layer (called a spacer layer or non-magnetic intermediate layer) interposed between two metallic ferromagnetic layers to fix magnetization of one of the ferromagnetic layers (called a pinned layer or magnetically pinned layer) in one direction under a bias magnetic field from an anti-ferromagnetic layer or hard magnetic layer and to permit the other ferromagnetic layer (called a free layer of magnetically free layer) to incline its magnetization direction relative to the pinned layer in response to an external magnetic field such that a giant magnetoresistance can be obtained.

Among SV films of this type, a CPP (current-perpendicular-in-plane) type SV element configured to carry a current approximately perpendicular to the SV film plane exhibits a larger giant magnetoresistance effect than CIP (current-in-plane) type SV elements.

As one type of CPP elements, a TMR element using a tunneling magnetoresistance effect) film has been developed as well. Such a TMR film includes an insulating layer of $Al_2O_3$ as the spacer layer. The TMR film has the same layer configuration as that of the SV film from the viewpoint of the function.

The CPP magnetoresistance effect element using a magnetoresistance effect film (both a SV film and a magnetoresistance effect film are regarded herein to include a GMR film and a TMR film) not only exhibits a larger rate of MR change than CIP elements but also has the advantage that miniaturization of the element contributes to increasing the quantity of MR change because the resistance of the element relies on the element area.

This advantage is very useful in this era where magnetic devices are progressively miniaturized. For example, also regarding magnetic heads using SV films, which are under improvement of the recording density by approximately 60% a year, those using CPP magnetoresistance effect elements are regarded to be more and more hopeful along with progressive miniaturization of the reproducing head portions in accordance with improvements of the recording density.

Although, however, those CPP magnetoresistance effect elements have the above-mentioned advantages, they involve the problem about the scaling rule, which is peculiar to CPP elements, because the rate of MR change decreases when the element size approaches the mean free path of electrons. This phenomenon is not large as far as the element size is sufficiently large relative to the mean free path of electrons, but becomes serious together with onward miniaturization of the element.

That is, although conventional CPP magnetoresistance effect elements can cope with miniaturization to a certain extent, they are not readily applicable to superfine magnetic devices that will be desired in future, and could not perform their full function.

SUMMARY OF THE INVENTION

The present invention has been made taking those problems into account. It is therefore an object of the invention to provide a CPP magnetoresistance effect element that ensures a high rate of MR change and a large quantity of MR change without departing from the scaling rule even when its size is near the mean free path of electrons. A further object of the invention is to provide a magnetic device, especially a magnetoresistance type magnetic head, using the CPP magnetoresistance effect element, and a magnetic reproducing apparatus and a magnetic storage device using the magnetic device.

To accomplish the objects, a magnetoresistance effect element according to the first embodiment of the invention comprises:

a magnetoresistance effect film having a magnetically pinned layer which includes a ferromagnetic film whose magnetization direction is pinned substantially in one direction, a magnetically free layer which includes a ferromagnetic film whose magnetization direction varies with an external magnetic field, and a non-magnetic intermediate layer interposed between the magnetically pinned layer and the magnetically free layer;

a pair of electrodes electrically connected to the magnetoresistance effect film to carry a current in a direction approximately perpendicular to the film plane of the magnetoresistance effect film; and sidewall layers formed at least on side surfaces of the magnetically pinned layer, the non-magnetic intermediate layer and the magnetically free layer of the magnetoresistance effect film.

The sidewall layer may be formed by, for example, oxidizing, nitrifying, fluoridating, carbonizing, sulfurating or boronizing the side surface of the magnetoresistance effect film.

Since the sidewall layer is stabilized more when crystallized, the above-summarized configuration produces the effect that oxygen, nitrogen, fluorine, carbon, sulfur or boron contained in the sidewall layer is unlikely to spread into the magnetoresistance effect film. Additionally, since the crystallized portion clearly defines the boundary between the sidewall layer and the magnetoresistance effect film and thereby makes a sharp potential profile at the boundary, there is also the effect that the specular reflection effect of conduction electrons of the sense current further increases. Since the increase of the specular reflection effect results in making the best use of the mean free path of electrons, degradation of the MR-changing rate is prevented.

That is, the sidewall layer made of a compound of an oxide, nitride, fluoride, carbide, boride or sulfide on the side surface of the magnetoresistance effect film produces the specular reflection effect of electrons. Additionally, it is possible to prevent a decrease of the MR-changing amount.

If the sidewall layer is in form of a compound phase containing, as a major component thereof, an oxide, fluoride, nitride, boride, carbide or sulfide of any one selected from the group consisting of B, Al, Si, Ge, W, Nb, Mo, P, V, Sb, Zr, Hf, Y, Ti, Ta, Zn, Pb, Cr, Sn, Ga, Cu and rare earth elements, then the potential profile at the boundary can be sharpened, and the specular reflection effect of electrons on the side surface of the magnetoresistance effect film can be enhanced.

If the side wall layer contains at least one kind of element selected from the group consisting of Fe, Co and Ni, and at least one kind of element selected from the group consisting of B, Al, Si, Ge, W, Nb, Mo, P, V, Sb, Hf, Zr, Y, Ti, Ta, Zn, Pb, Cr, Sn, Ga, N, O, F, S, C, Cu and rare earth elements, then the potential profile at the boundary can be sharpened, and the specular reflection effect of electrons on the side surface of the magnetoresistance effect film can be enhanced.

If the sidewall layer is in form of a mixture phase mixing an amorphous phase and a crystalline structure containing Fe, Co or Ni as a major component, its resistance can be increased, and simultaneously, spontaneous magnetization thereof by Fe, Co or Ni in the crystalline structure enhances the bias effect from the hard bias film and the anti-ferromagnetic bias film. For the purpose of enhancing the resistance of the sidewall layer, the crystal grain side of the crystalline portion had better be small, and the maximum grain size is preferably not larger than 20 nm. The ratio the crystalline structure occupies in the sidewall layer is preferably not more than 50% to ensure a high resistance. Therefore, the content of Fe, Co or Ni in the sidewall layer is preferably not more than 70 atomic %, and more preferably, not more than 50 atomic %. That content may be otherwise determined in case the crystalline structure is made of an oxide, fluoride, nitride, boride, carbide or sulfide.

If the sidewall layer includes an amorphous phase containing as its major component an oxide, fluoride, nitride, boride, carbide or sulfide of at least one kind of element selected from the group consisting of B, Al, Si, Ge, W, Nb, Mo, P, V, Sb, Hf, Y, Zr, Ti, Ta Zn, Pb, Cr, Sn, Ga and rare earth metals, diversion of the sense current from the side surface of the magnetoresistance effect film can be prevented.

In case the sidewall layer contains, as its major component, an oxide, fluoride, nitride, boride, carbide or sulfide of at least one kind of element selected from the group consisting of B, Al, Si, Ge, W, Nb, Mo, P, V, Sb, Hf, Y, Zr, Ti, Ta Zn, Pb, Cr, Sn, Ga and rare earth metals, the specular reflection effect at the side surface of the magnetoresistance effect film can be enhanced. In this case, if the sidewall layer is in form of a mixture of a crystalline structure and an amorphous phase, both an increase of the specular reflection effect by the crystalline phase and an increase of the resistance by the amorphous structure can be realized simultaneously.

The sidewall layer may contain as its major component an oxide, fluoride, nitride, boride, carbide or sulfide of at least one kind of element selected from the group consisting of Fe, Co., Ni, Mn, B, Al, Si, Ge, W, Nb, Mo, P, V, Sb, Hf, Zr, Ti, Ta, Zn, Pb, Cr, Sn, Ga and rare earth metals, and may be in form of a substantially amorphous phase.

Crystallization of the sidewall layer produces the effect that oxygen, nitrogen, fluorine, carbon, sulfur or boron contained in the sidewall layer is unlikely to spread into the magnetoresistance effect film. Additionally, since the crystallized portion clearly defines the boundary between the sidewall layer and the magnetoresistance effect film and thereby makes a sharp potential profile at the boundary, there is also the effect that the specular reflection effect of conduction electrons of the sense current further increases.

As a method of identifying a "crystalline phase," electron diffraction, for example, may be used. For example, if a diffraction spot having an orderly arrangement is observed in an electron diffraction image obtained through a transmission type electron microscope (TEM), the structure can be confirmed to be crystalline. More precisely, if a period suggesting an orderly arrangement is found in the diffraction intensity of the electron diffraction image, the structure can be confirmed to be crystalline. If equally spaced interstitial images, i.e. lattice images, derived from a certain plane orientation, or moire images caused by the overlap of lattices, are observed, then the structure is determined to be crystalline.

The "amorphous phase" can be identified, for example, by the fact that no such periodicity is found in the electron diffraction, or the like.

Whether a structure is a "mixture of an amorphous phase and a crystalline phase" can be confirmed if both properties of a crystalline phase and an amorphous phase are observed depending on the location of the sample.

Whether it is magnetic or not can be confirmed by measuring magnetization of a thin film sample of the sidewall layer prepared by the same method. Alternatively, it can be known by measuring magnetization of a bulk sample or thin film sample of the same composition, based on a result of chemical composition analysis by EDX (energy dispersive X-ray spectroscopy), for example.

In any version of the magnetoresistance effect element according to the invention summarized above, thickness of the sidewall layer is preferably in the range from 0.5 nm to 10 nm. If the thickness is less than 0.5 nm, the sidewall layer cannot make a sharp potential profile at the boundary, and a sufficient effect of specular reflection cannot be obtained. Additionally, the sidewall layer is too thin to prevent diversion of the sense current.

On the other hand, if the thickness of the sidewall layer is 10 nm or more, effects of the use of the hard bias film and anti-ferromagnetic bias film for exerting a biasing effect to the free layer are seriously diluted due to magnetic decoupling, and it may result in deterioration of S/N ratio of the magnetoresistance head.

The magnetoresistance effect element according to the embodiment of the invention summarized above can be incorporated into a reproducing magnetic head to obtain a highly sensitive magnetic head.

The magnetoresistance head, thus obtained, can be mounted in a magnetic reproducing apparatus to enable stable reproduction of super-densely recorded information.

A magnetic storage device having a plurality of magnetoresistance effect elements according to any one of the above-summarized types is useful as MRAM (magnetic random access memory) that can magnetically rewrite information. That is, when the magnetoresistance effect element according to the embodiment of the invention is used in MRAM having no hard bias film or anti-ferromagnetic bias film, the sidewall layer having the specular reflection effect shows its effect.

As summarized above, according to the embodiment of the invention, since a CCP type magnetoresistance effect element has formed a sidewall layer on a side surface of the magnetoresistance effect film, high MR-changing rate and large MR-changing amount can be obtained even in a magnetoresistance effect element of a submicron size or a smaller size without departing from the scaling rule.

In addition to that, it is also possible to provide a magnetic head having high output power and high S/N, magnetic reproducing apparatus using same, and magnetic storage device using same. Thus the invention has remarkable industrial advantages.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION OF THE INVENTION

The Inventor made researches about the problem that conventional CPP type magnetoresistance effect elements decrease in MR changing rate as the element size approaches the mean free path of electrons. As a result, the Inventor has found that it occurs because conduction electrons flowing substantially perpendicularly to the film plane scatter by non-elastic collision at the sidewall of the magnetoresistance effect film and cannot fulfill their mean free path. The inventor has also found that the spin information of electrons may disappear even if they scatter by elastic collision.

Some embodiments of the invention will now be explained below with reference to the drawings.

Figure 1:
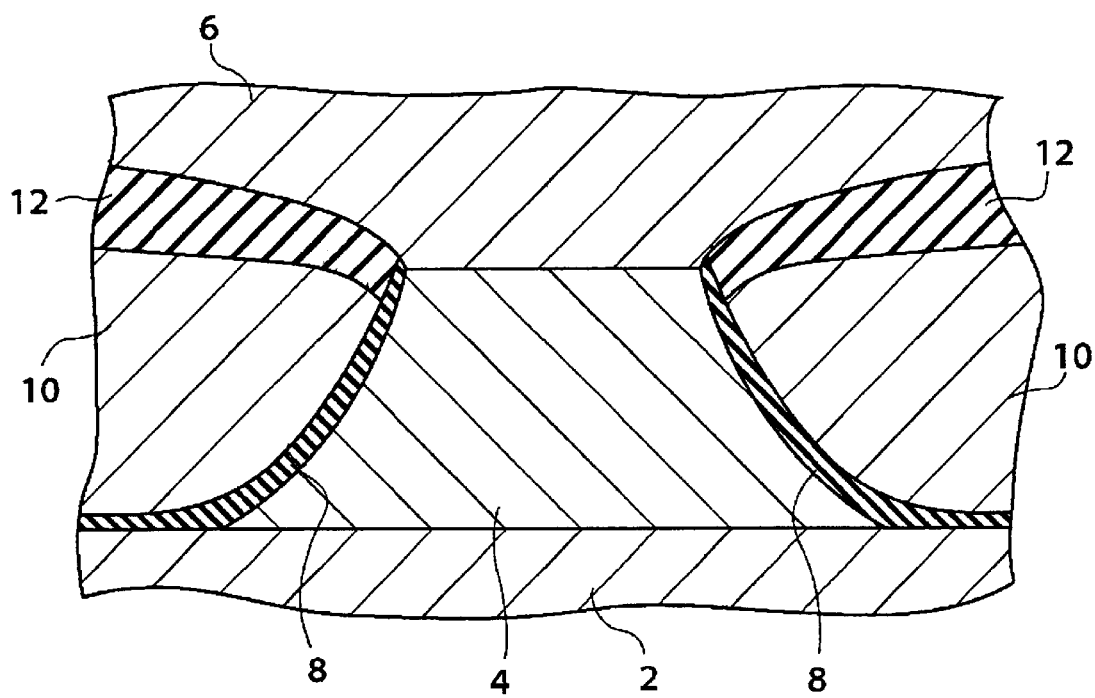
FIG. 1 is a fragmentary, cross-sectional view of a magnetoresistance effect element mounted in a magnetic head according to an embodiment of the invention, taken along a plane substantially in parallel to the medium-facing surface P thereof.
Figure 2:
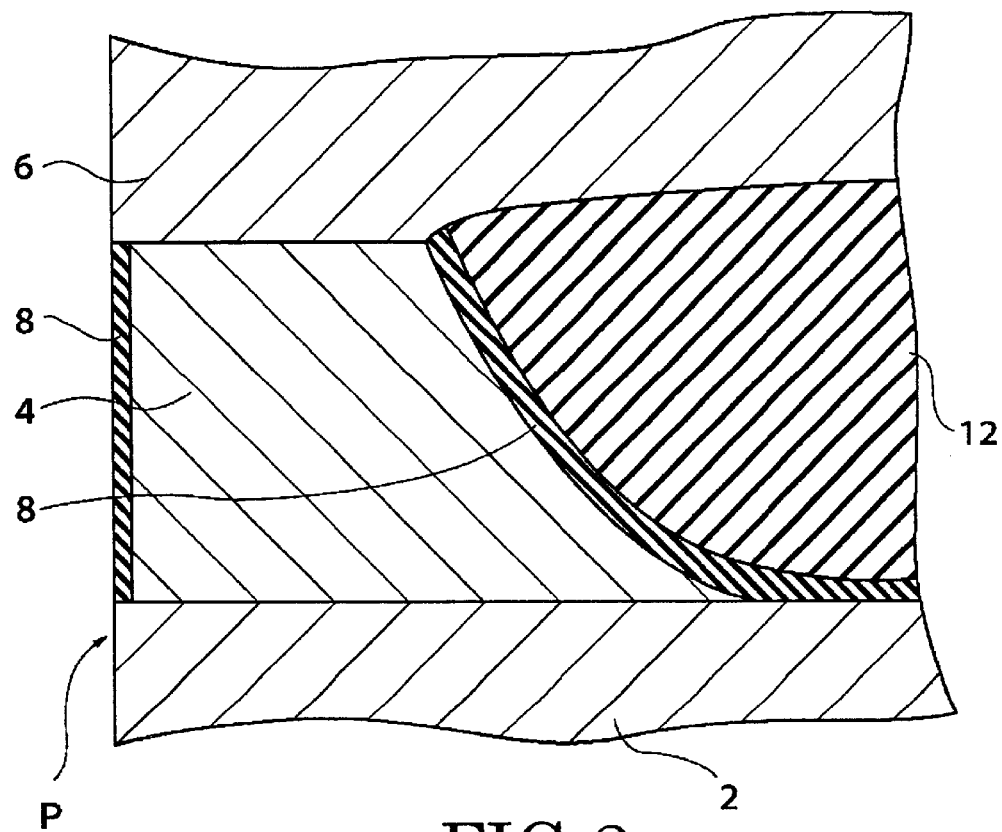
FIG. 2 is a fragmentary, cross-sectional view of the magnetoresistance effect element of FIG. 1, taken along a plane perpendicular to the medium-facing surface P thereof.

FIGS. 1 and 2 are diagrams schematically showing configuration of the substantial part of a magnetoresistance effect element mounted in a magnetic head, according to an embodiment of the invention. More specifically, FIG. 1 is a fragmentary, cross-sectional view of the magnetoresistance effect element, taken along a plane substantially in parallel to the medium-facing surface P thereof facing to a recording medium (not shown). FIG. 2 is a fragmentary, cross-sectional view of the magnetoresistance effect element, taken along a plane perpendicular to the medium-facing surface P.

The magnetoresistance effect element shown in FIGS. 1 and 2 has a hard-abutted structure including an upper electrode 6 and a lower electrode 2 on and under a magnetoresistance effect film 4. Referring to FIG. 1, on opposite side surfaces of the magnetoresistance effect film 4, bias magnetic field-applying films 10 and insulating films 12 stacked via sidewall layers 8. As shown in FIG. 2, each sidewall layer 8 also extends to the medium-facing surface of the magnetoresistance effect film 4 and the back surface opposite from the medium-facing surface. That is, the sidewall layer 8 extends all around the side surfaces of the patterned magnetoresistance effect film 4.

The electrodes 2, 6 on and under the magnetoresistance effect film 4 carries the sense current to the magnetoresistance effect film 4 substantially perpendicularly to the film plane as shown by arrow A. The pair of bias magnetic field-applying films 10, 10 a bias magnetic field to the magnetoresistance effect film 4 from right and left sides thereof. The bias magnetic field controls the magnetic anisotropy of the free layer of the magnetoresistance effect film 4 to singularize the magnetic domain. This results in stabilizing the magnetic domain structure and preventing Barkhausen noise following a movement of the magnetic wall.

By forming the sidewall layer 8 effective for specular reflection of electrons on side surfaces of the magnetoresistance effect film 4, the embodiment of the invention ensures the effect of specular reflection of conduction electrons at side surfaces of the magnetoresistance effect film 4. That is, it is possible to prevent non-elastic scattering of electrons on sidewalls of the magnetoresistance effect film 4 and to elongate the mean free path of electrons. Furthermore, even after elastic scattering of electrons on sidewalls of the magnetoresistance effect film 4, the embodiment of the invention prevents the spin information of electrons from disappearing and thereby remarkably improves the sensitivity of the magnetoresistance effect element.

Moreover, by the use of the high-resistance sidewall layer 8, the embodiment of the invention also ensures the effect of preventing diversion of the sense current to the bias magnetic field-applying films 10. That is, the embodiment of the invention efficiently supplies the sense current to the magnetoresistance effect film 4 and thereby improves the output efficiency.

By the use of the sidewall layer 8, the embodiment of the invention also enables appropriate control of the bias magnetic field from the bias magnetic field-applying films 10.

More specifically, in case the magnetoresistance effect element is miniaturized, the spacing between the pair of bias magnetic field-applying films 10, 10 is also narrowed, and the magnetoresistance effect film applied with an excessive intensity of the bias magnetic field may decrease in sensitivity. That is, excessive bias magnetic field may undesirably pin the magnetic domain of the free layer. The embodiment of the invention, however, which uses the sidewall layer 8 formed between the magnetoresistance effect film 4 and the bias magnetic field-applying films 10, appropriately moderates the bias magnetic field from the bias magnetic field-applying films 10 and thereby satisfies both the biasing effect and the sensitivity of the free layer to the magnetic field.

However, in case there is the need of preventing the loss of the bias magnetic field from the bias magnetic field-applying films 10, the sidewall layer 8 may be provided with ferromagnetism. That is, if the sidewall layer 8 is made of a ferromagnetic material, then it can transfer the bias magnetic field from the bias magnetic field-applying films 10 to the magnetoresistance effect film 4 with only a small loss.

The embodiment of the invention is especially effective when the element is miniaturized. When the element is miniaturized to the order of the mean free path of electrons, the volume of the portion near the boundary becomes to occupy a larger part of the magnetoresistance effect element, and it results in increasing non-elastic scattering or diversion of electrons, fluctuation of the bias magnetic field, and so forth.

The embodiment of the invention, however, which uses the sidewall layer 8 effective for specular reflection of electrons, prevention of diversion, moderation of the bias magnetic field, and so forth, effectively alleviates the loss, diversion of the sense current and increase of the bias magnetic field at the boundary, and thereby remarkably improves the magnetic detection sensitivity of the magnetoresistance effect element.

Next made is a detailed explanation about respective components of the magnetoresistance effect element according to the embodiment of the invention.

Figure 3A:
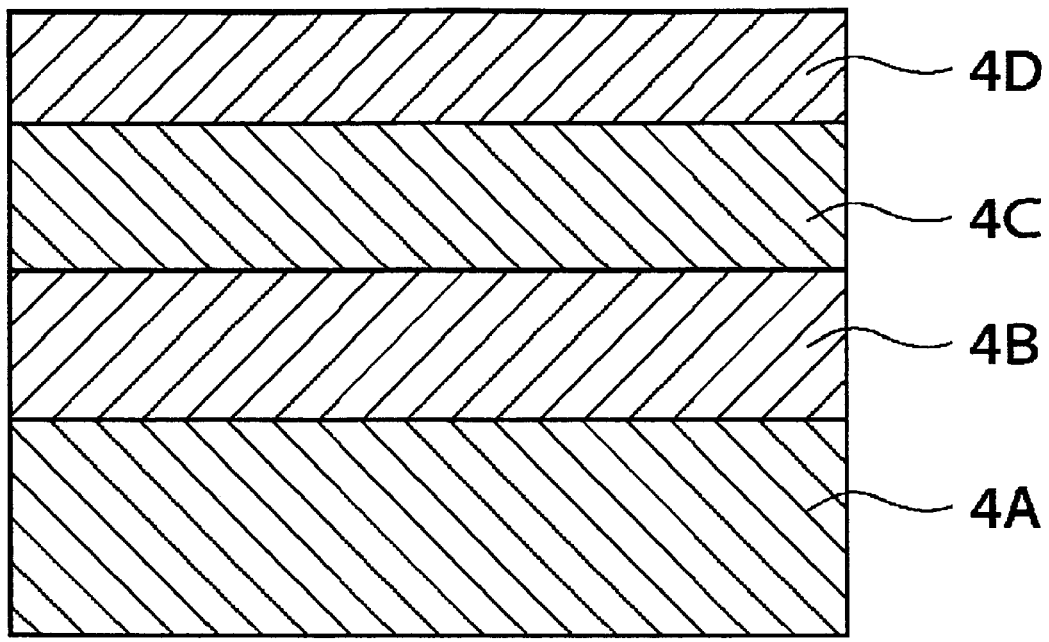
FIGS. 3A and 3B are cross-sectional views schematically showing different basic configurations of a magnetoresistance effect film 4.
Figure 3B:
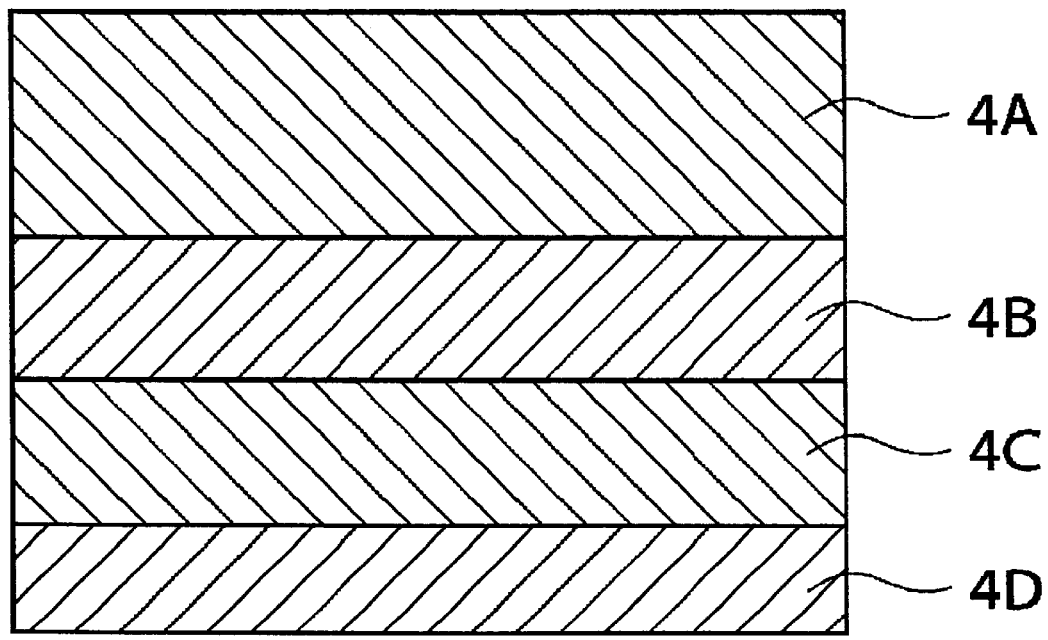

FIGS. 3A and 3B are cross-sectional views schematically showing different basic configurations of a magnetoresistance effect film 4. FIG. 3A shows a configuration stacking the free layer 4A, spacer layer 4B, pinned layer 4C and anti-ferromagnetic layer 4D in this order. This kind of configuration stacking the anti-ferromagnetic layer 4D higher than the pinned layer 4C is called a "top type".

In contrast, in the configuration shown in FIG. 3B, the anti-ferromagnetic layer 4D, pinned layer 4C, spacer layer 4B and free layer 4A are stacked in this order. This type of configuration stacking the pinned layer 4C higher than the ferromagnetic layer 4D is called a "bottom type".

The magnetoresistance effect element actually includes a base layer, not shown, for example, under the structure shown in FIGS. 3A or 3B, and a protective layer, for example, on the structure. In addition to the configurations shown in FIGS. 3A and 3B, a "dual type" configuration symmetrically stacking SV structures on and under the free layer is also employable.

The free layer 4A and the pinned layer 4C are ferromagnetic layers typically made of a binary or ternary alloy containing at least one of Fe, Co and Ni as its major component. Main such alloys are $Co_{90}Fe_{10}$ alloy, $Ni_{80}Fe_{20}$ alloy (Permalloy) and Co—Fe—Ni alloy. Alternatively, the free layer 4A may be a multi-layered structure of a plurality of such alloys.

To increase the MR changing rate, a specular reflection layer in form of an oxide layer, nitride layer or fluoride layer having an effect of specular reflection of electrons may be inserted at least in one of the free layer 4A and the pinned layer 4C. Such a magnetoresistance effect film is usually called a "specular type" magnetoresistance effect film, for example. A high-conduction layer may be additionally stacked on or under the free layer 4A. This type of magnetoresistance effect film is called a "spin filter type" film.

The pinned layer 4B may have a synthetic anti-ferromagnetic structure. The "synthetic anti-ferromagnetic structure" is a pinned layer having a multi-layered structure typically of an anti-ferromagnetic layer, Ru (ruthenium) layer and ferromagnetic layer in which upper and lower ferromagnetic layers are in anti-ferromagnetic coupling via the Ru layer.

Materials usable as the spacer layer 4B include Cu, Au and Ag, for example. $Al_2O_3$ may be additionally used. This corresponds to the TMR film explained above.

Materials of the anti-ferromagnetic layer 4D include Mn-based anti-ferromagnetic films such as PtMn, IrMn, RhMn and PdMn alloys.

The base layer, not shown, may be made of, for example, Ta (tantalum) or non-magnetic NiFeCr alloy. The base layer serves as a buffer layer for controlling crystallographic properties and orientations of respective layer stacked thereon.

The protective layer, not shown, may be a film of a non-magnetic material such Ta or Cr, for example.

The bias magnetic field-applying films 10 may be made of a ferromagnetic or anti-ferromagnetic material, as explained later in greater detail, and may be patterned by a lift-off process. In the hard-abutted structure shown in FIG. 1, bias-applying films of a ferromagnetic material are preferably used. Its structure may be, for example, a Cr/CoCrPt multi-layered film or Cr/CoPt multi-layered film. Thereby, Barkhausen noise of the magnetoresistance head can be reduced.

The sidewall layer 8 may be made of a compound containing one of oxides, nitrides, fluorides, sulfides, carbides and borides. The sidewall layer 8, when having such a compound phase, sharpens the potential profile on side surfaces of the magnetoresistance effect film 4, and contributes to the specular reflection effect of conduction electrons. It results in preventing non-elastic scattering of electrons at the side surfaces of the magnetoresistance effect film 4, thereby to allow the best use of the mean free path of conduction electrons and prevent deterioration of the MR characteristics.

The sidewall layer 8 need not be continuous throughout its entire area, but may include holes. Additionally, the sidewall layer 8 may vary in thickness from one to another of the layers forming the magnetoresistance effect film 4, side surfaces of which are covered by the sidewall layer 8.

To ensure the electron reflection effect of the sidewall layer 8, it is essential that the sidewall layer 8 covers side surfaces of the free layer 4A and the pinned layer 4C at least. Desirably, however, the sidewall layer 8 lies on side surfaces of the spacer layer 4B and the protective layer as well.

Thickness of the sidewall layer 8 is preferably in the range from 0.5 nm to 10 nm. If the sidewall layer 8 is thinner than 0.5 nm, it cannot make a sufficient electron potential difference at the boundary of side surfaces of the magnetoresistance effect film 4, and cannot accomplish satisfactory specular reflection. Additionally, it cannot sufficiently control diversion of the sense current. If the sidewall layer 8 reaches 10 nm thick or more, although those effects are ensured, the bias magnetic field of the bias magnetic field-applying films seriously decreases, and it may results in deteriorating the S/N ratio of the magnetic head.

From the viewpoint of preventing diversion of the sense current, the sidewall layer 8 is preferably made of a material whose specific resistance is not lower than 100 $\mu\Omega$cm. Considering that specific resistance values of respective metal layers used in the magnetoresistance effect film 4 are normally not less than 50 $\mu\Omega$cm, a specific resistance of that degree is necessary.

In order to realize a high resistance of the sidewall layer 8, the sidewall layer 8 preferably has a structure of an amorphous phase or a mixture phase combining an amorphous phase and a crystalline phase. If the sidewall layer 8 is in an amorphous phase or a mixture phase combining an amorphous phase and a crystalline phase, it may be either ferromagnetic or non-magnetic.

When the sidewall layer 8 is made of an amorphous material, the amorphous material preferably contains, as its main component, an oxide, fluoride, nitride, boride, car bide or sulfide containing at least one kind of Fe, Co, Ni, Mn, B, Si, Ge, W, Nb, P, V, Sb, Hf, Zr, Ti, Ta, Zn, Pb, Cr, Sn, Ga and rare earth elements as its major component.

When the sidewall layer 8 is made of a crystalline material, the crystalline material preferably contains, as its main component, an oxide, fluoride, nitride, boride, car bide or sulfide containing at least one kind of Fe, Co, Ni, Mn, B, Al, Si, Ge, W, Nb, P, V, Sb, Hf, Zr, Ti, Ta, Zn, Pb, Cr, Sn, Ga and rare earth elements as its major component. By oxidizing, fluoridating, nitrifying, boronizing, carbonizing or sulfurating any one of those elements, a high resistance can be realized. Simultaneously, the effect of specular reflection is also enhanced because the boundary surface becomes clear at side surfaces of the magnetoresistance effect film 4 and a sharp potential profile is formed at the boundary.

The sidewall layer 8 is most preferably made of an oxide, nitride, fluoride, sulfide, boride or carbide of those elements. If an oxide is used to form the sidewall layer 8, its formation is relatively easy. That is, the sidewall layer 8 can be made by oxidizing side surfaces of the magnetoresistance effect film 4.

Moreover, the use of an oxide contributes to increasing the energy gap of the magnetoresistance effect film 4 from the conduction band of each layer. That is, the oxide sharpens the potential profile at the interface and increases the specular reflection effect. Further, oxides have resistance values exceeding 100 $\mu\Omega$cm. If a crystalline phase is used as the oxide, a spinel structure may be used as its structure.

Figure 4:
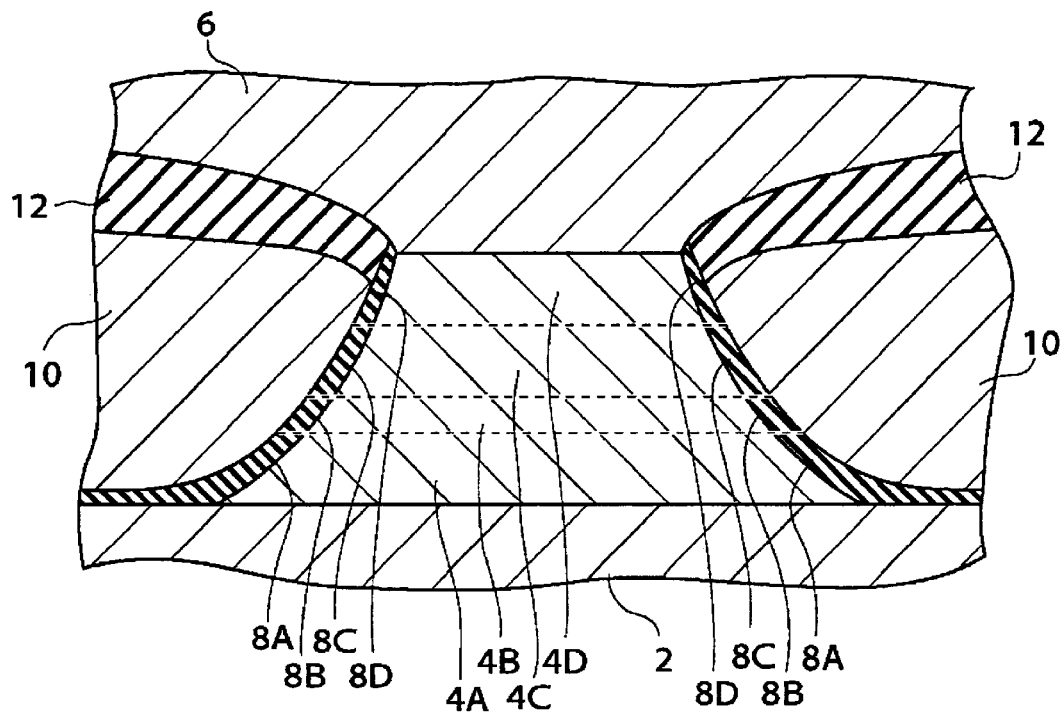
FIG. 4 is a fragmentary, cross-sectional view of a magnetoresistance effect element having a sidewall layer made by oxidizing a side surface of the magnetoresistance effect element.

FIG. 4 is a fragmentary, cross-sectional view of a magnetoresistance effect element having a sidewall layer made by oxidizing a side surface of the magnetoresistance effect element. In FIG. 4, common or equivalent components to those already explained with reference to FIGS. 1 through 3 are labeled with common reference numerals, and their detailed explanation is omitted.

Here is shown a "tope type" magnetoresistance effect film 4, and for simplicity, its base layer, protective layer, etc. are omitted from illustration. The actual element, however, includes a base layer and a protective layer, not shown, arranged appropriately.

As shown in FIG. 4, when the side surfaces of the magnetoresistance effect film 4 are oxidized to form the sidewall layer 8, oxides corresponding to materials of respective layers forming the magnetoresistance effect film 4 are formed on side surfaces of the respective layers. That is, a sidewall layer 8A of an oxide of the elements composing the free layer 4A is formed on side surfaces of the free layer 4A, a sidewall layer 8B of an oxide of elements composing the spacer layer 4B is formed on side surfaces of the spacer layer 4B, and so on. In this manner, sidewall surfaces 8A through 8D of oxides having different compositions corresponding to the respective layers 4A through 4D of the magnetoresistance effect film 4 make up the sidewall layer 8.

Also when the sidewall layer 8 is made of a nitride, fluoride, sulfide or boride, layers having different compositions make up the sidewall layer 8 similarly.

When the sidewall layer 8 is crystalline, it can prevent dispersion of oxygen, nitrogen, fluorine, boron or carbon to the magnetoresistance effect film 4 even when the material of the sidewall layer is a compound containing, as its major component, Fe, Co, Ni, Mn, etc. that is the major component of the magnetoresistance effect film 4. That is, the crystalline sidewall layer 8 improves the heat resistance of the magnetoresistance effect film 4.

To prevent the loss of the bias magnetic field from the bias magnetic field-applying films 10, the sidewall layer 8 is preferably ferromagnetic or anti-ferromagnetic. The sidewall layer 8 is especially preferred to be ferromagnetic. The ferromagnetic sidewall layer 8 maintains the biasing effect to the free layer 4A of the bias magnetic field-applying films 10.

Typical oxides, nitrides, fluorides, carbides and borides that are magnetic and crystalline include $Fe_{16}N_2$, $Fe_3O_4$, $CrO_2$ and $Co_2O_3$, for example.

To prevent dispersion of oxygen, nitrogen fluorine or carbon contained in the sidewall layer 8 toward the bias magnetic field-applying films 10, the sidewall layer 8 is preferably multi-layered.

Figure 5:
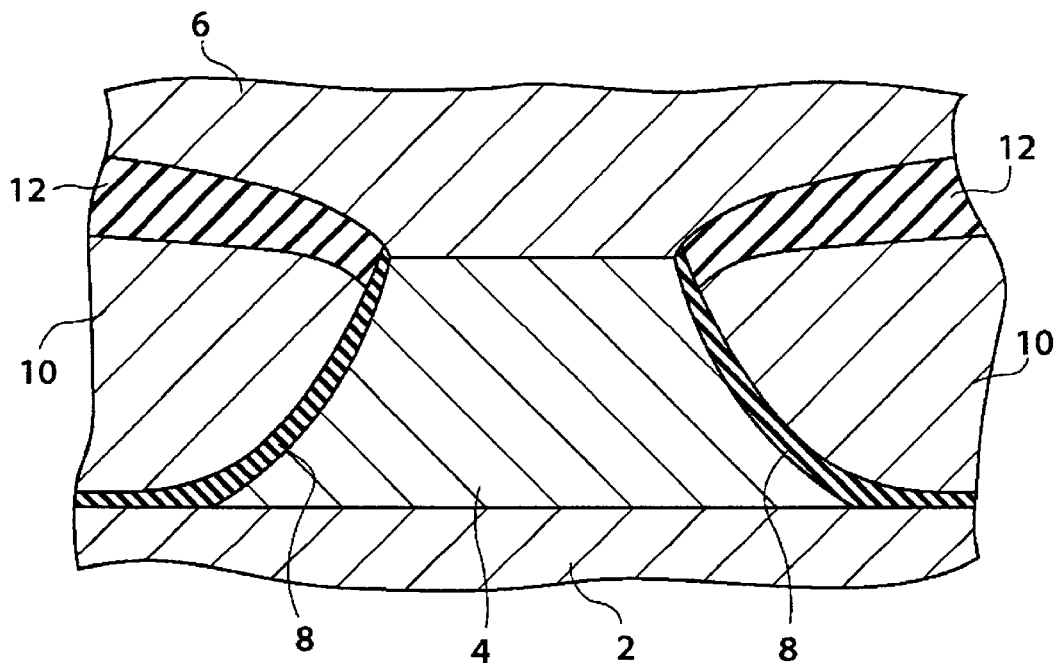
FIG. 5 is a fragmentary, cross-sectional view of a magnetoresistance effect element having a two-layered sidewall layer 2.

FIG. 5 is a fragmentary, cross-sectional view of a magnetoresistance effect element having a two-layered sidewall layer 2. In FIG. 5, common or equivalent components to those already explained with reference to FIGS. 1 through 3 are labeled with common reference numerals, and their detailed explanation is omitted.

In case of the magnetoresistance effect element shown in FIG. 5, the sidewall layer 8 is made by stacking a first sidewall layer 8A and a second sidewall layer 8B sequentially from the side surfaces of the magnetoresistance effect film 4. It is contemplated here to stack any adequate number of layers not limited to two layers only.

In the sidewall layer 8 having the multi-layered structure including N layers, the (N−1)-numbered sidewall layer counted from the magnetoresistance effect film 4 is preferably made of a compound containing, as its major component, an oxide, nitride, fluoride, carbide, sulfide or boride of a first element selected from the elements in the sequence of B, Si, Ge, Ta, W, Nb. Al, Mo, P, V, As, Sb, Zr, Ti, Zn, Pb, Al, Sb, Th, Be, Zr, Cd, Sc, La, Y, Pt, Cr, Sn, Ga, Cu, In, Th, Rh, Pd, Pb, Mg, Li, Zn, Ba, Ca, Sr, Mn, Fe, Co, Ni, Cd and Rb, and the Nth sidewall layer outwardly adjacent thereto is preferably made of a compound containing, as its major component, an element positioned after the first element of the (N−1)-numbered sidewall layer in the sequence of the same elements. This is because elements in later positions in the above sequence of elements are lower in coupling energy with oxygen, etc., therefore less likely to be oxidized, nitrified, fluoridated, boronized, sulfurized, or carbonized, and make it more difficult for oxygen, etc. to disperse toward the bias magnetic field-applying films 10 or anti-ferromagnetic bias film.

In case the bias magnetic field-applying films 10 are made of a ferromagnetic material, taking account of using Cr, for example, as the base layer, the outermost layer of the sidewall layer 8 is preferably made of a compound containing, as its major component, an element positioned former than Cr in the above sequence of elements.

From the viewpoint of preventing dispersion, an anti-dispersion layer is most desirably formed between the outermost sidewall layer and the bias magnetic field-applying films 10.

Figure 6:
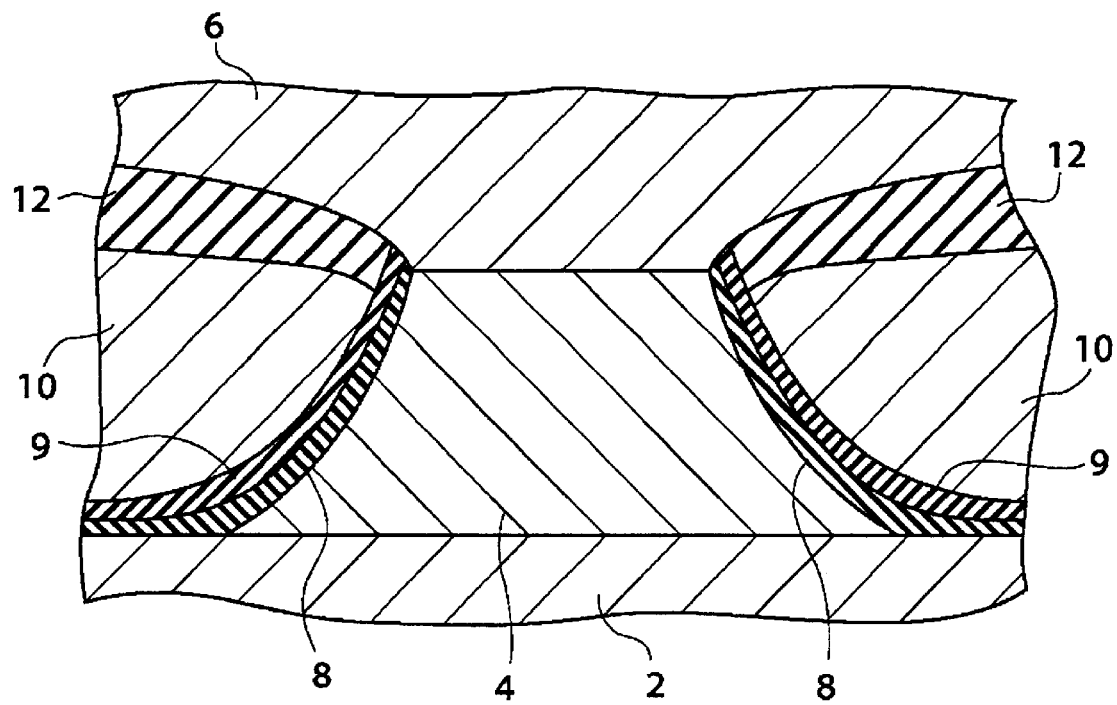
FIG. 6 is a fragmentary, cross-sectional view of a magnetoresistance effect element having a diffusion-preventing layer.

FIG. 6 is a fragmentary, cross-sectional view of a magnetoresistance effect element having a diffusion-preventing layer. In FIG. 6, common or equivalent components to those already explained with reference to FIGS. 1 through 3 are labeled with common reference numerals, and their detailed explanation is omitted.

In the magnetoresistance effect element shown in FIG. 6, an anti-dispersion layer 9 is formed between the sidewall layer 8 and the bias magnetic field-applying films 10. The anti-dispersion layer 9 preferably contains, as its major component, an element selected from the group consisting of Au, Cu, Ru, Rh, Ag, Ir, Pd, Pt and Os. Any of these elements contributes to preventing oxygen, nitrogen, fluorine, sulfur, carbon or boron contained in the sidewall layer 8 from diffusing toward the bias magnetic field-applying films 10, and thereby contributes to maintaining a satisfactory effect of specular reflection.

Thickness of the anti-dispersion layer 9 is preferably in the range from 0.5 nm to 5 nm, and the total thickness of the sidewall layer 8 and the anti-dispersion layer 9 is preferably not larger than 10 nm. If the thickness of the anti-dispersion layer 9 is less than 0.5 nm, it is not effective for preventing dispersion. If the thickness is larger than 5 nm, it may invite a significant deterioration of the effectiveness of the hard bias or anti-ferromagnetic bias from the bias magnetic field-applying films 10. Both the sidewall layer 8 and the anti-dispersion layer 9 may be multi-layered, respectively.

The magnetoresistance effect element having the abutted structure shown in FIGS. 1 and 2 can be made by a lift-off process. Outline of the process is explained below.

First formed is the magnetoresistance effect film 4 by DC magnetron sputtering, for example. After that, the magnetoresistance effect film 4 is patterned through resist patterning by lithography using a lift-off resist and through dry etching such as ion milling. The sidewall layer 8 is formed after ion milling or other processing of the magnetoresistance effect film 4. Thereafter, the bias magnetic field-applying films 10 and the insulating film 12 are formed, and the resist is removed.

In the process of patterning the magnetoresistance effect film 4, side surfaces of the magnetoresistance effect film 4 preferably incline by an angle not larger than 45 degrees from the normal line of the substrate especially on side surfaces of the free layer 4A, spacer layer 4B and pinned layer 4C (active part of the magnetoresistance effect film 4). That is, the magnetoresistance effect film 4 is formed so that its side surfaces are oriented nearer to vertical directions. The magnetoresistance effect film 4 performs its specular reflection effect of electrons at the side surfaces thereof.

A smoothing process for smoothing the side surfaces of the magnetoresistance effect film 4 may be inserted prior to forming the sidewall layer 8. The smoothing process may be carried out by irradiating ion beams of an inactive gas (Ar, Xe, Ne, or the like) or cluster beams of an inactive gas onto side surfaces of the magnetoresistance effect film 4. This is effective for smoothing side surfaces of the magnetoresistance effect film 4 and for clearly defining the boundary from the sidewall layer 8. In case of irradiating ion beams, the acceleration energy therefore is preferably limited to and below 500 V to minimize magnetic damage to the magnetoresistance effect film 4. To decrease the irradiation energy, the beams are preferably applied obliquely to the side surfaces. More specifically, ion beams are preferably irradiated from an angle not larger than 60 degrees relative to the normal line of the substrate.

Since ion milling is typically used for processing the magnetoresistance effect film 4, irradiation of ion beams can be carried out continuously over two different purposes. In the actual process, therefore, ion-milling process combining two different injection angles may result in being carried out continuously.

Also in case of employing irradiation of cluster beams, it is preferably carried out continuously from ion milling. The term "continuous" herein contemplates progression from one step to another while maintaining the vacuum condition.

Unevenness of side surfaces of the magnetoresistance effect film 4 is preferably limited to or below 5 nm. If the unevenness exceeds 5 nm, the sidewall layer 8 made by oxidizing or fluoridizing side surfaces of the magnetoresistance effect film 4 cannot smooth the interface unless it is formed to a thickness beyond 10 nm, and such a large thickness of the sidewall layer 8 may weaken the bias magnetic field from the bias magnetic field-applying films 10. The unevenness expressed here regarding side surfaces is directed to unevenness of side surfaces within the extent of each component layer of the magnetoresistance effect film 4, and does not refer to the smoothness of the entire side surfaces all the component layers make up. Nevertheless, it is also desirable to minimize the level difference between every adjacent component layers to finally smooth the entire side surfaces of the magnetoresistance effect film 4.

The sidewall layer 8 may be formed by any of the following three methods.

(1) A compound such as an oxide, nitride or fluoride is deposited on side surfaces of the magnetoresistance effect film 4 by DC or RF sputtering, CVD (chemical vapor deposition) or ion beam sputtering.

(2) A metal layer is formed on side surfaces of the magnetoresistance effect film 4, and thereafter, predetermined radical beams, ion beams or their mixture beams are irradiated onto the metal layer to form a compound layer such as an oxide, nitride or fluoride.

(3) Predetermined radical beams, ion beams of their mixture beams are directly irradiated onto side surfaces of the magnetoresistance effect film 4 to directly oxidize, nitrify or fluoridize the side surfaces of the respective component layers of the magnetoresistance effect film 4.

The sidewall layer 8 made by any of those methods can be observed by cross-sectional transmission electron microscopy. In case the sidewall layer 8 has been made by the method (3), since the sidewall layer 8 varies in thickness from a component layer to another of the magnetoresistance effect film 4, the method for forming it can be identified.

In the method (2) above, desirable methods of forming the oxide from the viewpoint of enhancing the specular reflection effect and obtaining a high resistance includes, for example: oxidation of side surfaces of the magnetoresistance effect film 4 by introducing oxygen into the chamber or by processing with oxygen containing radicals; and oxidation by irradiating an ionized gas. Especially when an activated reactive gas is used, a more stable oxide having a stable crystalline structure can be made. In this case, the reactive gas itself may be ionized and irradiated, or the reactive gas may be introduced into the chamber from another place while argon, xenon or neon is ionized and irradiated.

Next explained is a modification of the magnetoresistance effect element according to the embodiment of the invention.

Figure 7:
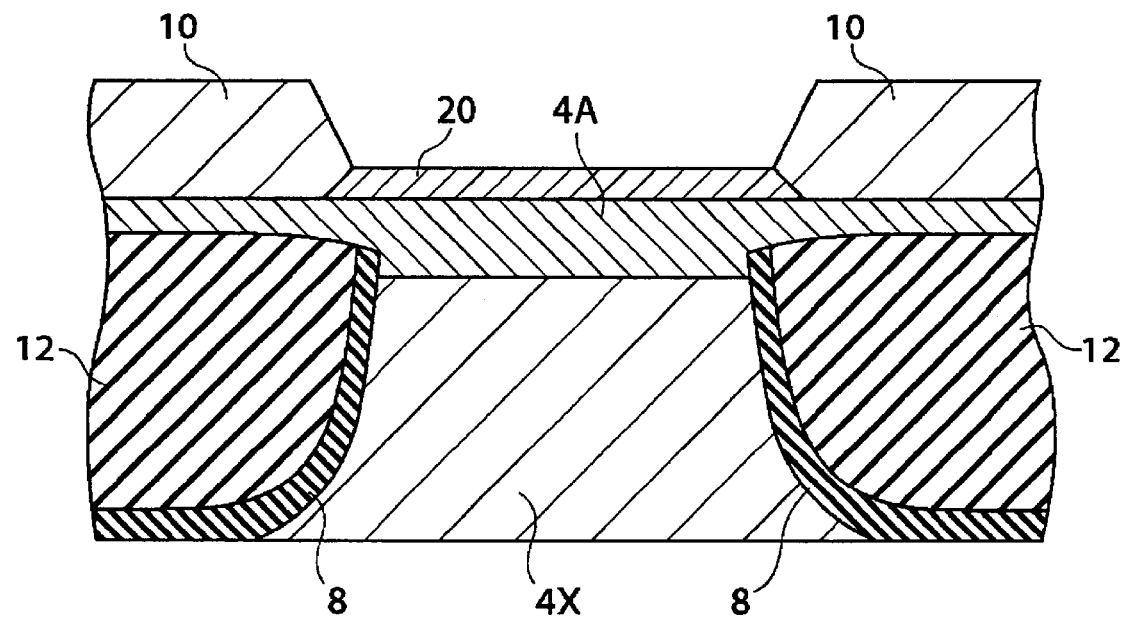
FIG. 7 is a fragmentary, cross-sectional view of a magnetic head having a "patterned exchange bias (PEB) structure using a bias magnetic field-applying film made of an anti-ferromagnetic material.
Figure 8:
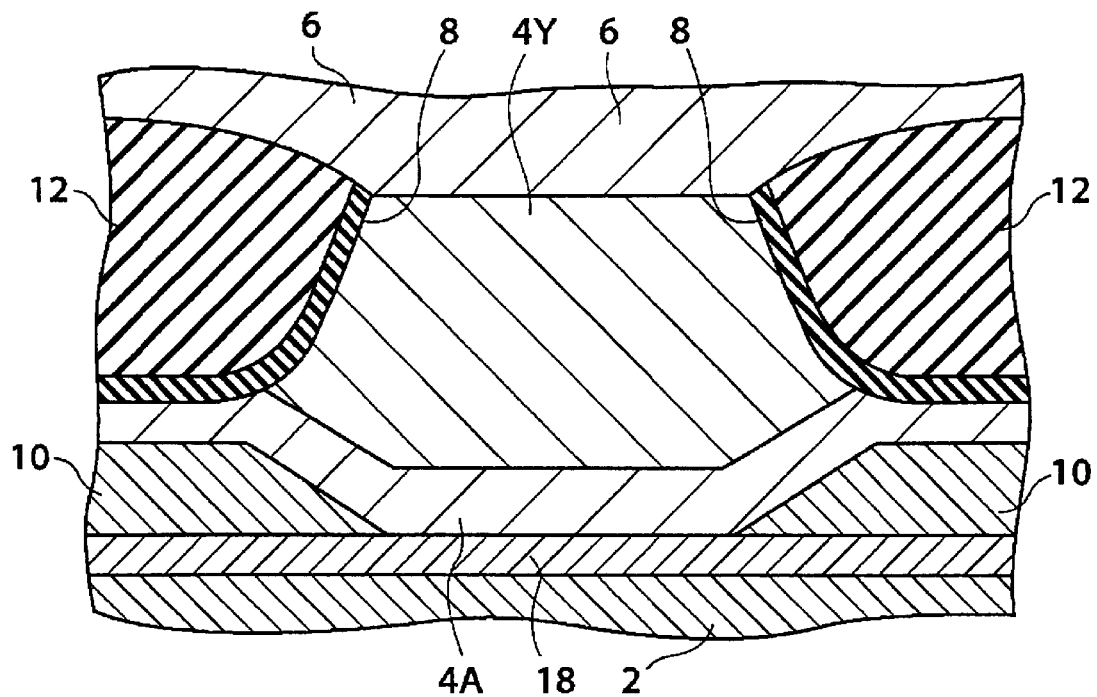
FIG. 8 is a fragmentary, cross-sectional view pf a magnetic head having a PEB structure using a bias magnetic field-applying film made of an anti-ferromagnetic material.
Figure 9:
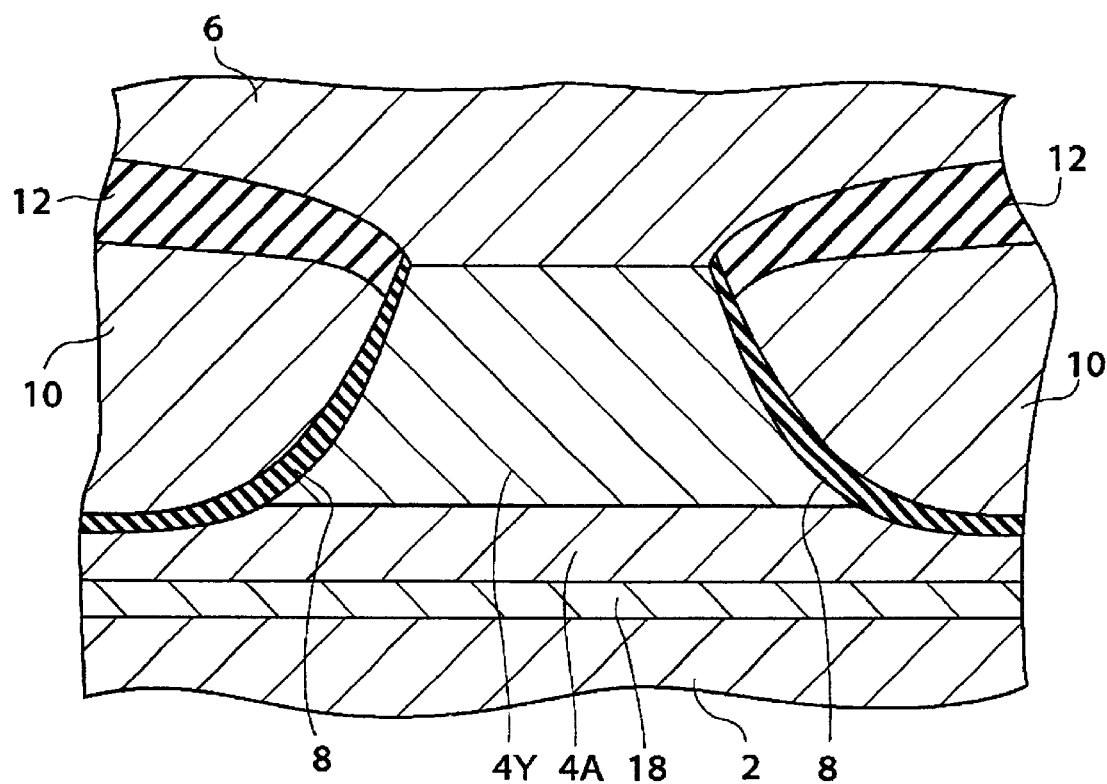
FIG. 9 is a fragmentary, cross-sectional view pf a magnetic head having a PEB structure using a bias magnetic field-applying film made of an anti-ferromagnetic material.

FIGS. 7 through 9 are cross-sectional views taken along planes substantially in parallel to medium-facing surfaces of magnetoresistance effect elements provided in magnetic heads according to embodiments of the invention. In these drawings, common or equivalent components to those already explained with reference to FIGS. 1 through 3 are labeled with common reference numerals, and their detailed explanation is omitted.

FIGS. 7 through 9 show magnetoresistance effect elements each having a "patterned exchange bias (PEB)" type structure using a bias magnetic field-applying films 10 of an anti-ferromagnetic material.

The magnetic head shown in FIG. 7 has a "bottom type" magnetoresistance effect film 4 including a protective film 4F, free layer 4A and other layers 4X including a base layer (not shown) and a pinned layer (not shown). The part of the layers 4X is patterned narrower, and the free layer 4A extends horizontally beyond the width of the layers 4X.

The sidewall layer 8 is formed to extend over side surfaces of the layers 4X and the upper surface of a lower electrode 2. The bias magnetic field-applying films 10 are stacked on the opposite end parts of the free layer 4A extending beyond the width of the layers 4X.

The magnetic head shown in FIG. 8 has a "top type" magnetoresistance effect film 4 including a base layer 4G, free layer 4A, and other layers 4Y including a pinned layer (not shown). The part of the layers 4Y is patterned narrower, and the free layer 4A extends horizontally beyond the width of the layers 4Y.

The sidewall layer 8 is formed to extend over side surfaces of the layers 4Y and the upper surface of the free layer 4A. The bias magnetic field-applying films 10 are stacked on the opposite end parts of the free layer 4A extending beyond the width of the layers 4Y.

The magnetic head shown in FIG. 8 also has a "top type" magnetoresistance effect film 4 including a base layer 4G, free layer 4A, and other layers 4Y including a pinned layer. The part of the layers 4Y is patterned narrower, and the free layer 4A extends horizontally beyond the width of the layers 4Y.

The sidewall layer 8 is formed to extend over side surfaces of the layers 4Y and upper surfaces of opposite end portions of the free layer 4A extending beyond the width of the layers 4Y. The bias magnetic field-applying films 10 are stacked on the opposite end parts of the free layer 4A extending beyond the width of the layers 4Y.

The PEB structures shown in FIGS. 7 through 9 each increase the efficiency of the magnetic head using a CPP magnetoresistance effect element to the external magnetic field. That is, they contribute to realizing highly sensitive magnetic heads.

EXAMPLES

Some examples of the invention will be explained below.

First Example

A magnetoresistance effect element having a hard abutted structure as shown in FIGS. 1 and 2 was prepared as the first example of the invention, and its characteristics were evaluated. Its manufacturing process is outlined below with reference to FIGS. 1 and 2.

First formed on a substrate covered with thermally oxidized $SiO_2$ is the lower electrode 2 having a multi-layered structure of materials and thicknesses of Ta 10 nm/Cu 400 nm/Ta 5 nm by using a DC/RF magnetron sputtering apparatus.

After that, by using the DC/RF magnetron sputtering apparatus, the magnetoresistance effect film 4 having the "bottom type" multi-layered structure including layers having the following materials and thicknesses.

| Protective layer: | Ta | 10 nm |
| Free layer: | NiFeCo | 5 nm |
| Free layer: | CoFe | 2 nm |
| Spacer layer: | Cu | 2 nm |
| Pinned layer: | CoFe | 3 nm |
| Pinned layer: | Ru | 0.9 nm |
| Pinned layer: | CoFe | 3 nm |
| Anti-ferromagnetic layer: | PtMn | 10 nm |
| Base layer: | NiFeCr | 3 nm |
| Base layer: | Ta | 3 nm |

After the magnetoresistance effect film 4 stacked in this manner was patterned, the sidewall layer 8 was formed. As the sidewall layer, a Cr oxide was formed to the thickness of 5 nm. For forming it, a 1 nm thick film of metallic Cr was formed, and a step of oxygen radical irradiation (30 seconds) was repeated twice. For the oxygen radical irradiation, 1 sccm of Ar and 5 sccm of $O_2$ were introduced to a plasma source and excited to plasma therein, and the plasma was introduced from an irradiation opening distant from the substrate by 10 through 15 cm under a pressure difference between the plasma source and the chamber.

After that, the bias magnetic field-applying films 10 having a multi-layered structure of 5 nm thick Cr and 50 nm thick CoCrPt were formed in an ion beam sputtering apparatus. Thereafter, a 50 nm thick insulating film 12 of $Al_2O_3$ was formed, and partly removed by lift-off of a resist.

After that, the upper electrode 6 having a multi-layered structure of 5 nm thick Ta, 400 nm thick Cu and 200 nm thick Au was formed by DC magnetron sputtering. For processing the respective portions, photolithography and an ion milling apparatus were used.

Then, the substrate was annealed at 270° C. for 10 hours under the magnetic field of 10 kOe for the purpose of magnetically pinning the pinned layer.

In the process of patterning the magnetoresistance effect film 4, a resist was patterned by photolithography, and the film was selectively etched by ion milling. In the process of ion milling, two different beam injection angles, i.e. 20 degrees and 70 degrees, relative to the normal line of the substrate were employed. The horizontal geometry of the magnetoresistance effect film 4 is approximately square, and five different kinds of elements sized 2 μm, 1 μm, 0.5 μm, 0.3 μm and 0.15 μm, each side, were prepared.

In this example, smoothing of the side surfaces of the magnetoresistance effect film 4 by Ar cluster beams was omitted. Elements having no sidewall layer 8 were also prepared as a comparative sample.

Shown below is a result of evaluation of MR characteristics of respective magnetoresistance effect elements related to the respective element sizes.

| Element Size (μm) | MR changing rate (%) | |
|---|---|---|
| | Example | Comparative Example |
| 2 | 1.01 | 1.00 |
| 1 | 1.00 | 0.97 |
| 0.5 | 1.00 | 0.84 |
| 0.3 | 0.99 | 0.76 |
| 0.15 | 0.97 | 0.51 |

The comparative examples decrease in MR changing rate as the element size decreases. In contrast, the elements according to the present example of the invention are substantially constant in MR changing rate even when the element size is miniaturized to 0.15 μm. In the comparative examples exhibiting a decrease of the MR changing rate with the decrease of the element size, it is assumed that influences of non-elastic scattering of electrons having spin information appear on side surfaces of the magnetoresistance effect film.

Even when they are evaluated using the parameter of (area A×resistance variance dR) as a guidepost of the output, the value decreases seriously with the downsizing of the elements in case of the comparative examples. The examples of the present invention, however, do not exhibit such decrease of (A×dR) with the downsizing of the elements, and they were held substantially constant around 0.5 mΩμm$^2$. Presumably, this is a result of the effect of preventing diversion of the sense current by the sidewall layer 8 made of a Cr oxide.

Second Example

Next explained is a result of using different methods of forming the sidewall layer 8 in the structure similar to that of the first example, as the second example of the invention.

Elements prepared here were magnetoresistance effect elements having the hard-abutted structure shown in FIGS. 1 and 2, and they were equal in size, namely 0.15 μm.

The process of making the elements was common to that of the first example except for the method of forming the sidewall layer 8. The sidewall layer 8 was made of a CR oxide. In this example, the following four methods were used for forming the Cr oxide.

(1) A method of forming a 1 nm thick film of metallic Cr on sidewall surfaces of the MR film and thereafter oxidizing it naturally.

(2) A method of forming a 1 nm thick film of metallic Cr on sidewall surfaces of the MR film and thereafter carrying out radical irradiation.

(3) A method of forming a 1 nm thick film of metallic Cr on sidewall surfaces of the MR film repeating three times the process and thereafter repeating a step of oxidizing it by ion irradiation three times.

(4) A process of forming a 5 nm thick layer of metallic Cr by reactive ion beam sputtering.

Natural oxidation of (1) above was conducted under the pressure in the order of $10^{-6}$ Torr.

Oxygen radical irradiation of (2) above was carried out by introducing 1 sccm of Ar (argon) and 5 sccm of $O_2$ to the plasma source and exciting them into plasma there, and thereafter introducing it from an irradiation opening distant from the substrate by 10 through 15 cm under a pressure difference between the plasma source and the chamber to oxidize the Cr film.

The ion irradiation oxidation of (3) above was carried out by introducing and exciting 1 sccm of Ar (argon) and 5 sccm of oxygen into plasma under the acceleration voltage of 50 eV.

The reactive ion beam sputtering of (4) above was conducted by sputtering a Cr target by Xe (xenon). In this process, 20% of oxygen was mixed to Xe.

Crystalline structures and MR characteristics of elements prepared by the respective methods are shown below.

| Method | Structure of sidewall layer | MR changing rate (%) |
|---|---|---|
| (1) Natural oxidation | Crystal + amorphous | 0.090 |
| (2) Oxygen radical irradiation | Crystal + amorphous | 0.097 |
| (3) Oxygen ion irradiation | Crystal + amorphous | 0.099 |
| (4) Ion beam sputtering | Amorphous | 0.085 |

Regardless of the element size being 0.15 μm, satisfactory MR changing rates were obtained without extreme differences among the methods.

By using the same methods (1) through (4), Cr oxides were formed on different substrates, and their products and their composition ratios were examined by EXAFS (extended X-ray absorption fine structure). Crystallographic properties of the measured elements were also observed by cross-sectional TEM.

All of the Cr oxides were confirmed to have the composition ratio of $Cr_2O_3$ as a result of EXAFS. $Cr_2O_3$ is anti-ferromagnetic.

By observation through cross-sectional TEM, lattice images were partly observed in the Cr oxide films made by the methods (1) through (3). That is, the Cr oxide films made by these methods were confirmed to have a mixture phase of an amorphous phase and a crystalline phase. However, those by the methods (2) and (3) were crystalline in almost all part thereof. The sidewall layer 8 made by the method (4), however, was confirmed to be amorphous substantially over its entire part.

In this example of the invention, there was observed the tendency of becoming small in the decrease of the MR changing rate as the crystal part of the Cr oxide occupied a larger part. This probably relied on that the crystal phase made a sharper potential profile at the boundary with the magnetoresistance effect film 4 and thereby enhanced the electron reflection effect.

Third Example

Next explained is a result of preparing sidewall layers 8 as the third example of the invention by various methods in magnetoresistance effect elements having the same structure as the first example. All the samples were equal in element size, namely, 0.15 μm.

Materials of the sidewall layer 8 prepared as this example, method of preparing them and MR properties of the obtained magnetoresistance effect elements are listed below.

| Sample | Sidewall Layer | Method of preparing the sidewall layer | MR changing rate (%) |
|---|---|---|---|
| 1 | Si oxide | $O_2$ radical irradiation | 0.100 |
| 2 | Ta oxide | $O_2$ radical irradiation | 0.097 |

-continued

| Sample | Sidewall Layer | Method of preparing the sidewall layer | MR changing rate (%) |
|---|---|---|---|
| 3 | Al oxide | Ion beam sputtering | 0.084 |
| 4 | Ta nitride | Reactive RF sputtering | 0.079 |
| 5 | Ti oxide | $O_2$ radical irradiation | 0.095 |
| 6 | Fe oxide | $O_2$ radical irradiation | 0.104 |
| 7 | a-Fe—Ta—N | Reactive RF sputtering | 0.087 |
| 8 | Fe—Ta—O | Reactive RF sputtering | 0.087 |

Among those manufacturing methods, reactive RF sputtering was conducted in an atmosphere mixing approximately 10 through 20% of oxygen gas or $N_2$ gas to Ar gas.

Throughout these samples, remarkable degradation of the MR changing rate was not observed as compared with the comparative examples explained with reference to the first example. The respective samples according to this example will be explained below in detail.

In the sample 1, the sidewall layer 8 substantially had the $SiO_2$ composition and was amorphous.

In the sample 2, most part of the sidewall layer 8 was made of an amorphous Ta oxide. Locally, however, lattice fringes were observed through cross-sectional TEM, and the sidewall layer 8 was confirmed to be a mixture phase of an amorphous phase and a crystal phase. In a later test, sidewall layers made by sputtering to fully amorphous exhibited slight degradation of the MR changing rate as compared with the sample 2. It suggests that mixture of a crystal phase maintains or increases the MR changing rate.

In the sample 3, the sidewall layer 8 was formed by using an $Al_2O_3$ target. The sidewall layer 8 was confirmed to be fully amorphous by cross-sectional TEM observation.

In the sample 4, the sidewall layer 8 was formed by using a Ta target and mixing 20% of $N_2$ gas into Ar gas. The sidewall layer 8 was confirmed to have an amorphous structure by cross-sectional observation. Also when a BN (boron nitride) film and an AlN film were formed by the same method, they were amorphous, and the same effects as those mentioned above were obtained.

In the sample 5, the sidewall layer 8 was formed by first making a 1 nm thick Ti layer and thereafter repeating the $O_2$ radical irradiation step three times. Almost all part of the sidewall layer 8 of this sample was an amorphous Ti oxide.

In the sample 6, the sidewall layer 8 was formed by first stacking a 1 nm thick Fe layer and thereafter repeating the $O_2$ radical irradiation step three times. Since some lattice fringes were observed by cross-sectional observation, the sidewall layer 8 was confirmed to contain a crystal phase. Taking Fe oxides formed by the same method, types of the products and their compositions were investigated by EXAFS. The same samples were also observed by TEM. Through these steps, the sidewall layer 8 was confirmed to be a mixture phase of a crystal phase and an amorphous phase. This is so-called a "granular structure".

As Fe oxides, there are FeO and $\alpha\text{-}Fe_2O_3$ that are antiferromagnetic, and $\gamma\text{-}Fe_2O_3$ and $Fe_3O_4$ that are ferrimagnetic. Additionally, as a ferromagnetic oxide, ferrite (Fe—Co—O, etc.) can be employed. Any of them is acceptable as the Fe oxide used in the sidewall layer 8.

In the sample 7, the sidewall layer 8 was formed by using $Fe_{50}Ta_{50}$ (atomic percent) as the sputtering target in a gas atmosphere introducing Ar plus 20% of $N_2$. Through measurement of magnetization of thin films prepared on different substrates by the same method for the evaluation purposes, the sidewall surface was confirmed to have spontaneous magnetization. As a result of cross-sectional TEM observation, the entirety of the sidewall layer 8 was confirmed to have a Fe—Ta—N amorphous structure.

In the sample 8, the sidewall layer 8 was formed by using $Fe_{70}Ta_{30}$ (atomic %) target in an atmosphere introducing Ar plus 10% of $O_2$ gas. As a result of TEM observation, the sidewall layer 8 was confirmed to comprise fine crystal grains of α-Fe having a body-centered cubic structure and the amorphous phase of Ta—O. All of the α-Fe crystal grains have grain sizes not larger than 50 nm. Taking thin films prepared on different substrates by the same method for the purpose of evaluation, their magnetization was measured and they were confirmed to have spontaneous magnetization. Additionally, in a curve of ρ (resistance) versus H (external magnetic field), which demonstrates the MR characteristics, it was observed that Hs (saturation magnetic field) of the free layer tended to increase. It suggests that the sidewall layer 8 having spontaneous magnetization contributed to increasing the effect of the hard bias magnetic field.

Additionally, the same experiment was carried out by introducing nitrogen instead of oxygen, and substantially the same effects were obtained. Furthermore, also when sidewall layers of respective oxides were formed by using targets of Fe—Zr, Co—Zr, Fe—Hf, Fe—Al and Co—Al, substantially the same effects were obtained.

Fourth Example

Next explained is a magnetic recording apparatus according to the embodiment of the invention. The magnetic head using the magnetoresistive element according to the embodiment of the invention, as explained with reference to FIGS. 1 through 9, can be incorporated in a magnetic head assembly of a recording/reproducing integral type, for example, and can be mounted in a magnetic recording apparatus.

Figure 10:
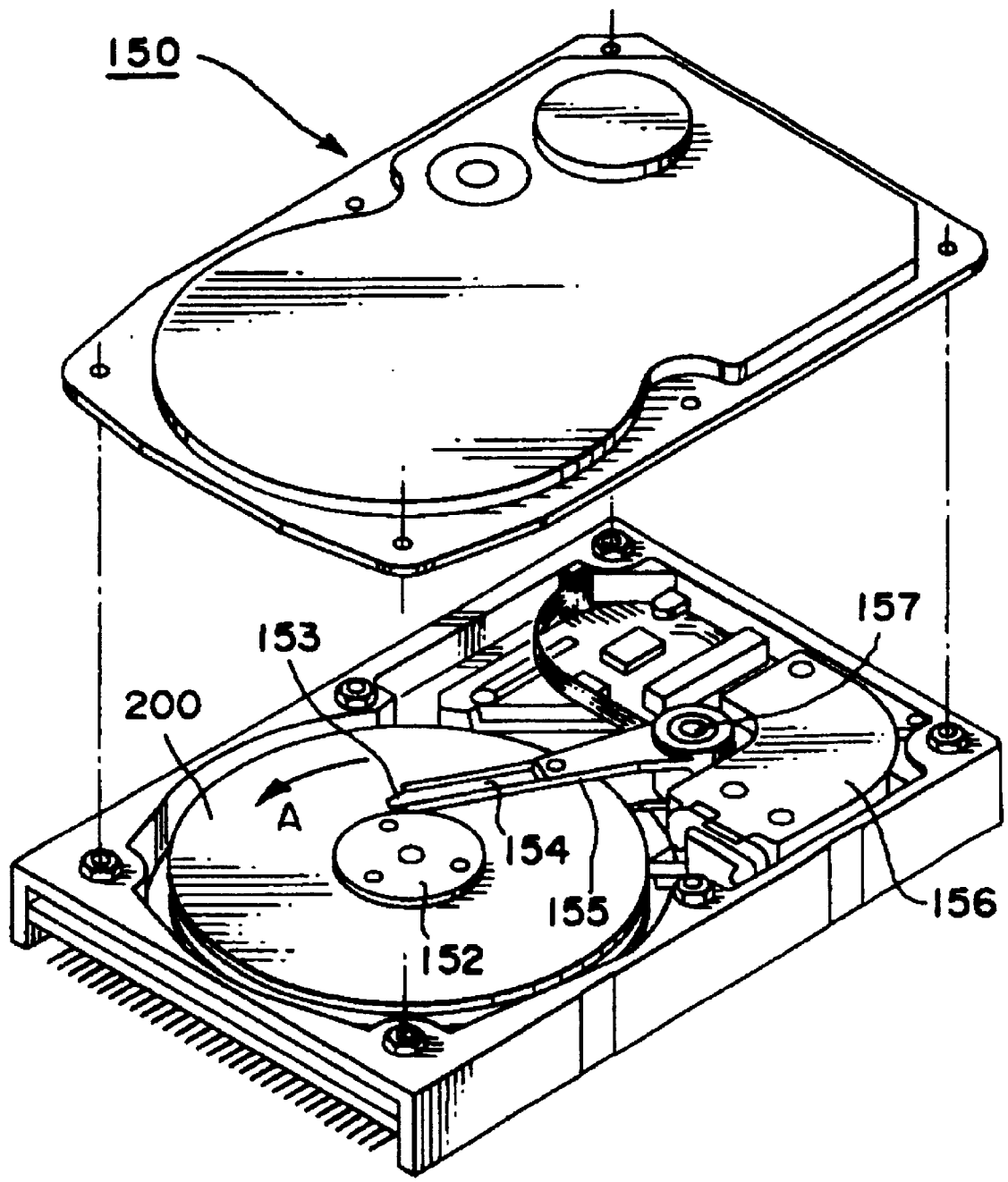
FIG. 10 is a perspective view that schematically shows a configuration of a major part of a magnetic recording/reproducing apparatus according to the embodiment of the invention.

FIG. 10 is a perspective view that schematically shows a configuration of a major part of a magnetic recording/reproducing apparatus according to the embodiment of the invention. The magnetic recording/reproducing apparatus 150 according to the embodiment of the invention is an apparatus of a type using a rotary actuator. In FIG. 10, a recording magnetic disk 200 is mounted on a spindle 152 and rotated in the arrow A direction by a motor, not shown, which is responsive to a control signal from a drive device controller, not shown. The apparatus 150 may include a plurality of magnetic disks 200.

A head slider 153 executed recording or reproduction of information to be stored in the magnetic disk 200 is attached to the tip of a thin-film suspension 154. The head slider 153 includes the magnetic head according to the any version of the foregoing embodiments near its tip.

When the magnetic disk 200 rotates, the medium-fronted surface (ABS) of the head slider 153 is held with a predetermined floating amount from the surface of the magnetic disk 200. Alternatively, the apparatus 150 may employ a contact-type configuration where the slider 153 is in contact with the disk 200 during the operation.

The suspension 154 is connected to one end of an actuator arm 155 that has a bobbin portion for holding a drive coil, not shown. At the other end of the actuator arm 155, a voice coil motor 156, which is a kind of linear motor, is provided. The voice coil motor 156 is composed of a drive coil, not shown, wound up on the bobbin portion of the actuator arm 155, and a magnetic circuit made up of a permanent magnet and an opposed yoke disposed in confrontation so as to sandwich the drive coil.

The actuator arm 155 is held by ball bearings, not shown, which are provided upper and lower two positions of a rigid shaft 157 for free rotational and slidable movements with a driving force from the voice coil motor 156.

Figure 11:
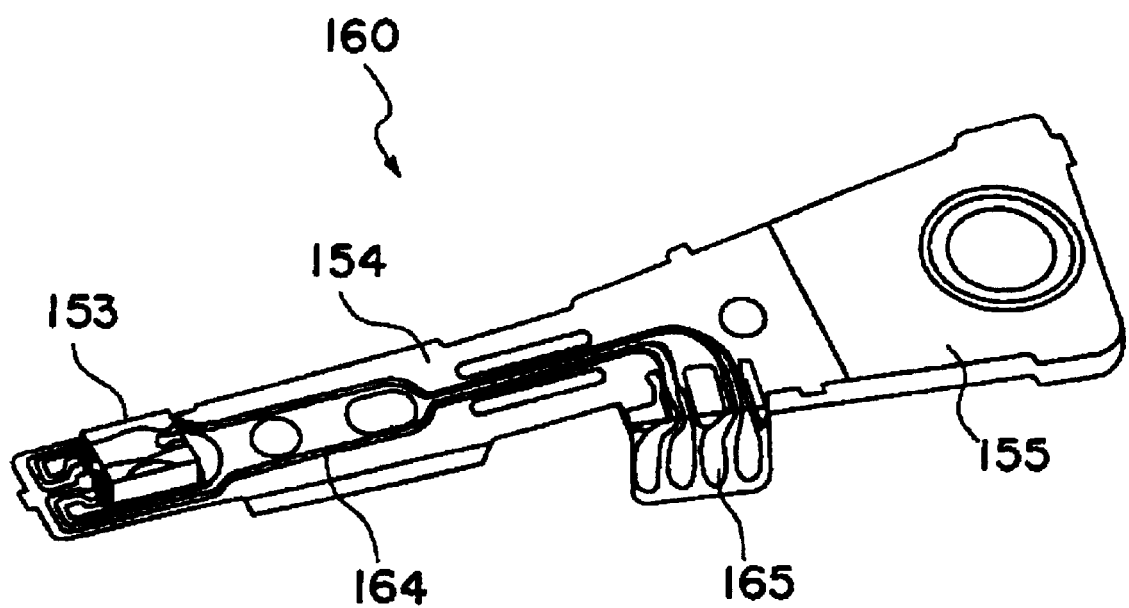
FIG. 11 is an enlarged, perspective view of the magnetic head assembly from the actuator arm 155 to its distal end, taken from the disk side.

FIG. 11 is an enlarged, perspective view of the magnetic head assembly from the actuator arm 155 to its distal end, taken from the disk side. The magnetic head assembly 160 includes the actuator arm 155 having the bobbin portion for holding the drive coil, for example, and the suspension 154 is connected to one end of the actuator arm 155.

At the extremity of the suspension 154, the head slider 153 incorporating the any version of the reproducing magnetic heads already explained with reference to FIGS. 1 through 9 is attached. A recording head may be combined with it. The suspension 154 has a lead line 164 for writing and reading signals, and the lead line 164 and electrodes of the magnetic head incorporated in the head slider 153 are electrically connected. Numeral 165 denotes an electrode pad of the magnetic head assembly 160.

The magnetic reproducing apparatus according to the embodiment of the invention, as shown in FIGS. 10 and 11, can greatly improve the reproducing capability of the recorded information with much higher recording density as compared with conventional systems, and can simultaneously improve the stability and reliability of reproduced signals.

Heretofore, some embodiments of the invention have been explained. The invention, however, is not limited to these specific examples. For example, regarding concrete structures of the magnetoresistance effect film 4 as well as shaped and materials of the electrodes, bias-applying films and insulating films, any person skilled in the art will be able to select appropriate equivalents from known designs and materials, to obtain equivalent effects.

For example, when the magnetoresistance effect element is used in a reproducing magnetic head, the detection resolution of the magnetic head can be regulated by providing magnetic shields on and under the element.

It will be also appreciated that the invention is applicable not only to magnetic heads or magnetic reproducing apparatuses of the lengthwise recording type but also to those of the perpendicular magnetic recording type and ensures substantially the same effects.

It will be also appreciated that the invention can employ a magnetic optical disk (MO disk).

The magnetic reproducing apparatus according to the embodiment of the invention may be of a so-called stationary type incorporating a particular recording medium in a stationary fashion, or of a so-called "removable" type permitting recording mediums to be loaded and unloaded.

On the other hand, the magnetoresistance effect element according to the invention is applicable not only for reading information from a magnetic recording medium but also to MRAM (magnetic random access memory) that can magnetically rewrite information, while ensuring the same effects.

Furthermore, the invention envisages all magnetoresistance effect elements, magnetic head and magnetic recording/reproducing apparatuses that any skilled in the art will be able to bring into practical use by appropriately modifying the design on the basis of the magnetic heads and magnetic recording apparatuses explained above as specific embodiments or examples of the invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetoresistance effect element comprising:

a magnetoresistance effect film having a magnetically pinned layer which includes a ferromagnetic film whose magnetization direction is pinned substantially in one direction, a magnetically free layer which includes a ferromagnetic film whose magnetization direction varies with an external magnetic field, and a non-magnetic intermediate layer interposed between the magnetically pinned layer and the magnetically free layer;

a pair of electrodes electrically connected to the magnetoresistance effect film to carry a current in a direction approximately perpendicular to a film plane of the magnetoresistance effect film; and sidewall layers formed at least on side surfaces of the magnetically pinned layer, the non-magnetic intermediate layer and the magnetically free layer of the magnetoresistance effect film, and the sidewall layers are substantially amorphous, and comprise as a major component thereof an oxide, fluoride, nitride, boride, carbide or sulfide of at least one element selected from a group consisting of B, Al, Si, Ge, W, Nb, Mo, P, V, Sb, Zr, Hf, Y, Ti, Ta, Zn, Pb, Cr, Sn, Ga, Cu and rare-earth elements.

2. A magnetoresistance effect element according to claim 1, wherein a thickness of the sidewall layers is in a range from 0.5 nm to 10 nm.

3. A magnetoresistance effect element comprising:

a magnetoresistance effect film having a magnetically pinned layer which includes a ferromagnetic film whose magnetization direction is pinned substantially in one direction, a magnetically free layer which includes a ferromagnetic film whose magnetization direction varies with an external magnetic field, and a non-magnetic intermediate layer interposed between the magnetically pinned layer and the magnetically free layer;

a pair of electrodes electrically connected to the magnetoresistance effect film to carry a current in a direction approximately perpendicular to a film plane of the magnetoresistance effect film; and sidewall layers formed at least on side surfaces of the magnetically pinned layer, the non-magnetic intermediate layer and the magnetically free layer of the magnetoresistance effect film, the sidewall layers are substantially amorphous, the sidewall layers include at least one element selected from a group consisting of Fe, Co and Ni, and at least one element selected from a group consisting of B, Al, Si, Ge, W, Nb, Mo, P, V, Sb, Hf, Zr, Y, Ti, Ta, Zn, Pb, Cr, Sn, Ga, N, O, F, S, C, Cu and rare-earth elements, and the sidewall layers are ferromagnetic.

4. A magnetoresistance effect element according to claim 3, wherein a thickness of the sidewall layers is in a range from 0.5 nm to 10 nm.

5. A magnetoresistance effect element comprising:

a magnetoresistance effect film having a magnetically pinned layer which includes a ferromagnetic film whose magnetization direction is pinned substantially in one direction, a magnetically free layer which includes a ferromagnetic film whose magnetization direction varies with an external magnetic field, and a non-magnetic intermediate layer interposed between the magnetically pinned layer and the magnetically free layer;

a pair of electrodes electrically connected to the magnetoresistance effect film to carry a current in a direction approximately perpendicular to a film plane of the magnetoresistance effect film; and sidewall layers formed at least on side surfaces of the magnetically pinned layer, the non-magnetic intermediate layer and the magnetically free layer of the magnetoresistance effect film, and the sidewall layers include a crystal phase comprising as a major component thereof at least one element selected from a group consisting of Fe, Co and Ni, and an amorphous phase comprising as a major component thereof an oxide, fluoride, nitride, boride, carbide or sulfide of at least one element selected from a group consisting of B, Al, Si, Ge, W, Nb, Mo, P, V, Sb, Hf, Zr, Ti, Ta, Zn, Pb, Cr, Sn, Ga and rare-earth elements.

6. A magnetoresistance effect element according to claim 5, wherein a thickness of the sidewall layers is in a range from 0.5 nm to 10 nm.

7. A magnetoresistance effect element comprising:

a magnetoresistance effect film having a magnetically pinned layer which includes a ferromagnetic film whose magnetization direction is pinned substantially in one direction, a magnetically free layer which includes a ferromagnetic film whose magnetization direction varies with an external magnetic field, and a non-magnetic intermediate layer interposed between the magnetically pinned layer and the magnetically free layer;

a pair of electrodes electrically connected to the magnetoresistance effect film to carry a current in a direction approximately perpendicular to a film plane of the magnetoresistance effect film; and sidewall layers formed at least on side surfaces of the magnetically pinned layer, the non-magnetic intermediate layer and the magnetically free layer of the magnetoresistance effect film, the sidewall layers comprise as a major component thereof an oxide, fluoride, nitride, boride, carbide or sulfide of at least one element selected from a group consisting of B, Al, Si, Ge, W, Nb, Mo, P, V, Sb, Hf, Y, Zr, Ti, Ta, Zn, Pb, Cr, Sn, Ga and rare-earth elements, and the sidewall layers are in a form of a mixture phase mixing an amorphous phase and a crystalline phase.

8. A magnetoresistance effect element according to claim 7, wherein a thickness of the sidewall layers is in a range from 0.5 nm to 10 nm.

9. A magnetoresistance effect element comprising:

a magnetoresistance effect film having a magnetically pinned layer which includes a ferromagnetic film whose magnetization direction is pinned substantially in one direction, a magnetically free layer which includes a ferromagnetic film whose magnetization direction varies with an external magnetic field, and a non-magnetic intermediate layer interposed between the magnetically pinned layer and the magnetically free layer;

a pair of electrodes electrically connected to the magnetoresistance effect film to carry a current in a direction approximately perpendicular to a film plane of the magnetoresistance effect film; and sidewall layers formed at least on side surfaces of the magnetically pinned layer, the non-magnetic intermediate layer and the magnetically free layer of the magnetoresistance effect film, the sidewall layers comprise as a major component thereof an oxide, fluoride, nitride, boride, carbide or sulfide of at least one element selected from a group consisting of Fe, Co, Ni, Mn, B, Al, Si, Ge, W, Nb, Mo, P, V, Sb, Hf, Zr, Ti, Ta, Zn, Pb, Cr, Sn, Ga and rare-earth elements, and the sidewall layers are substantially crystalline.

10. A magnetoresistance effect element according to claim 9, wherein a thickness of the sidewall layers is in a range from 0.5 nm to 10 nm.

11. A magnetic head including a magnetoresistance effect element comprising:

a magnetoresistance effect film having a magnetically pinned layer which includes a ferromagnetic film whose magnetization direction is pinned substantially in one direction, a magnetically free layer which includes a ferromagnetic film whose magnetization direction varies with an external magnetic field, and a non-magnetic intermediate layer interposed between the magnetically pinned layer and the magnetically free layer;

a pair of electrodes electrically connected to the magnetoresistance effect film to carry a current in a direction approximately perpendicular to a film plane of the magnetoresistance effect film; and sidewall layers formed at least on side surfaces of the magnetically pinned layer, the non-magnetic intermediate layer and the magnetically free layer of the magnetoresistance effect film, and the sidewall layers are substantially amorphous, and comprise as a major component thereof an oxide, fluoride, nitride, boride, carbide or sulfide of at least one element selected from a group consisting of B, Al, Si, Ge, W, Nb, Mo, P, V, Sb, Zr, Hf, Y, Ti, Ta, Zn, Pb, Cr, Sn, Ga, Cu and rare-earth elements.

12. A magnetic head according to claim 11, wherein a thickness of the sidewall layers is in a range from 0.5 nm to 10 nm.

* * * * *